(12) United States Patent
Lee et al.

(10) Patent No.: US 9,825,262 B2
(45) Date of Patent: Nov. 21, 2017

(54) ORGANIC LIGHT EMITTING DISPLAY APPARATUS AND METHOD OF MANUFACTURING THE SAME

(71) Applicant: LG DISPLAY CO., LTD., Seoul (KR)

(72) Inventors: Joon Suk Lee, Seoul (KR); Se June Kim, Paju-si (KR); So Jung Lee, Paju-si (KR); Jin-Hee Jang, Seoul (KR); Jong Hyeok Im, Busan (KR); Jae Sung Lee, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/346,245

(22) Filed: Nov. 8, 2016

(65) Prior Publication Data
US 2017/0054113 A1 Feb. 23, 2017

Related U.S. Application Data

(62) Division of application No. 14/984,561, filed on Dec. 30, 2015, now Pat. No. 9,543,544.

(30) Foreign Application Priority Data

May 28, 2015 (KR) .................. 10-2015-0075393

(51) Int. Cl.
| | |
|---|---|
| H01L 29/786 | (2006.01) |
| H01L 51/56 | (2006.01) |
| H01L 51/52 | (2006.01) |
| H01L 27/32 | (2006.01) |

(52) U.S. Cl.
CPC ............ *H01L 51/56* (2013.01); *H01L 27/326* (2013.01); *H01L 27/3218* (2013.01); *H01L 27/3246* (2013.01); *H01L 27/3248* (2013.01); *H01L 27/3258* (2013.01); *H01L 51/5203* (2013.01); *H01L 51/5209* (2013.01); *H01L 51/5228* (2013.01); *H01L 51/5253* (2013.01); *H01L 2227/323* (2013.01)

(58) Field of Classification Search
CPC ............. H01L 29/786; H01L 29/7869; H01L 29/78618; H01L 27/3258
See application file for complete search history.

(56) References Cited

U.S. PATENT DOCUMENTS

| | | | |
|---|---|---|---|
| 9,343,578 B2* | 5/2016 | Yamazaki | ........... H01L 29/7869 |
| 2003/0137325 A1 | 7/2003 | Yamazaki et al. | |
| 2004/0217704 A1 | 11/2004 | Iwase et al. | |
| 2005/0012454 A1 | 1/2005 | Yamazaki et al. | |
| 2005/0070086 A1* | 3/2005 | Isono | ................ H01L 21/76802 |
| | | | 438/618 |

(Continued)

FOREIGN PATENT DOCUMENTS

JP  2008135325 A1  6/2008

*Primary Examiner* — Phuc Dang
(74) *Attorney, Agent, or Firm* — Dentons US LLP

(57) ABSTRACT

Disclosed is an organic light emitting display apparatus in which an anode electrode, an organic emission layer, a cathode electrode, and an auxiliary electrode connected to the cathode electrode and disposed on the same layer as that of the anode electrode are disposed in an active area of the substrate, a signal pad and a pad electrode connected to the signal pad and covering a top of the signal pad are disposed in a pad area of the substrate, and a top of the pad electrode has lower oxidation rate than the top of the signal pad.

10 Claims, 11 Drawing Sheets

(56) References Cited

U.S. PATENT DOCUMENTS

| | | |
|---|---|---|
| 2006/0091396 A1 | 5/2006 | Lee et al. |
| 2006/0113900 A1 | 6/2006 | Oh |
| 2006/0267885 A1 | 11/2006 | Kwak et al. |
| 2007/0080356 A1 | 4/2007 | Nakayama et al. |
| 2007/0132365 A1* | 6/2007 | Kang .................. H01L 27/3258 313/500 |
| 2007/0194313 A1 | 8/2007 | Jung |
| 2008/0309233 A1 | 12/2008 | Hasegawa et al. |
| 2009/0058290 A1 | 3/2009 | Matsuura et al. |
| 2009/0153046 A1 | 6/2009 | Hayashi et al. |
| 2013/0001564 A1* | 1/2013 | Choi .................... H01L 27/3276 257/59 |
| 2013/0056784 A1 | 3/2013 | Lee et al. |
| 2013/0082249 A1 | 4/2013 | Kawanami et al. |
| 2013/0082270 A1 | 4/2013 | Ono et al. |
| 2013/0119392 A1 | 5/2013 | Park et al. |
| 2013/0141317 A1 | 6/2013 | Choi et al. |
| 2013/0171799 A1* | 7/2013 | Miyanaga ............. H01L 27/101 438/382 |
| 2014/0042394 A1 | 2/2014 | Lee |
| 2014/0159002 A1 | 6/2014 | Lee et al. |
| 2014/0225071 A1 | 8/2014 | Park et al. |
| 2014/0346448 A1 | 11/2014 | You et al. |
| 2015/0008398 A1* | 1/2015 | Lee ..................... H01L 51/5212 257/40 |
| 2016/0020422 A1 | 1/2016 | Kim et al. |
| 2016/0190225 A1 | 6/2016 | Kim et al. |
| 2016/0225907 A1* | 8/2016 | Kim .................... H01L 29/7869 |

\* cited by examiner

ORGANIC LIGHT EMITTING DISPLAY APPARATUS AND METHOD OF MANUFACTURING THE SAME

CROSS-REFERENCE TO RELATED APPLICATIONS

This application is a divisional of U.S. application Ser. No. 14/984,561, filed Dec. 30, 2015, now allowed, which claims the benefit of Korean Patent Application No. 10-2015-0075393, filed May 28, 2015, which is hereby incorporated by reference for all purposes as if fully set forth herein.

BACKGROUND

Field of the Invention

The present invention relates to an organic light emitting display apparatus. More particularly, the present invention relates to a top emission type organic light emitting display apparatus and a method of manufacturing the same.

Discussion of the Related Art

Organic light emitting display apparatuses are self-emitting apparatuses, have low power consumption, a fast response time, high emission efficiency, high luminance, and a wide viewing angle.

The organic light emitting display apparatuses are classified into a top emission type and a bottom emission type, based on a transmission direction of light emitted from an organic light emitting device. In the bottom emission type, a circuit element is disposed between an emission layer and an image displaying surface, and for this reason, an aperture ratio is lowered. On the other hand, in the top emission type, the circuit element is not disposed between the emission layer and the image displaying surface, and thus, an aperture ratio is enhanced.

FIG. 1 is a schematic cross-sectional view of a related art top emission type organic light emitting display apparatus.

As illustrated in FIG. 1, a thin film transistor (TFT) layer T which includes an active layer 11, a gate insulation layer 12, a gate electrode 13, an interlayer dielectric 14, a source electrode 15, and a drain electrode 16 formed in an active area AA on a substrate 10, and a passivation layer 20 and a planarization layer 30 are sequentially formed on the TFT layer T.

An anode electrode 40 and an auxiliary electrode 50 are formed on the planarization layer 30. The auxiliary electrode 50 decreases a resistance of a cathode electrode 80 to be described below.

A bank 60 is formed on the anode electrode 40 and the auxiliary electrode 50 and defines a pixel area. An organic emission layer 70 is formed in the pixel area defined by the bank 60, and the cathode electrode 80 is formed on the organic emission layer 70.

In the top emission type, light emitted from the organic emission layer 70 passes through the cathode electrode 80. Therefore, the cathode electrode 80 is formed of a transparent conductive material, and a resistance of the cathode electrode 80 increases. In order to decrease the resistance of the cathode electrode 80, the cathode electrode 80 is connected to the auxiliary electrode 50.

The gate insulation layer 12 and the interlayer dielectric 14 are formed in a pad area PA on the substrate 10, a signal pad 90 is formed on the interlayer dielectric 14, and the passivation layer 20 is formed on the signal pad 90. A hole is provided in the passivation layer 20, and the signal pad 90 is exposed to the outside through the hole. Since the signal pad 90 should be connected to an external driving circuit, the signal pad 90 is exposed to the outside by forming the hole in the passivation layer 20.

The related art top emission type organic light emitting display apparatus has the following problems.

Since the signal pad 90 should be connected to the external driving circuit, a top of the signal pad 90 is exposed to the outside. For this reason, the top of the signal pad 90 is corroded, and the corrosion is spread to another area. A metal layer which is excellent in corrosion resistance may be further formed on the top of the signal pad 90 so as to prevent the top of the signal pad 90 from being corroded, but in this case, the number of processes increases. Also, an electrode layer which is the same as the anode electrode 40 may be formed on the signal pad 90 through the same process so as to prevent the top of the signal pad 90 from being corroded without an increase in number of processes, but even in this case, it is unable to prevent corrosion from being spread through a side surface of the electrode layer.

Moreover, in order to connect the signal pad 90 to the external driving circuit, the top of the signal pad 90 is exposed by forming the hole in the passivation layer 20. But when the hole of the passivation layer 20 is previously formed, an etchant for pattern-forming the anode electrode 40 flows through the hole and damages the signal pad 90. In order to prevent the damage, a process of forming the hole of the passivation layer 20 for exposing the top of the signal pad 90 may be separately performed after a process of pattern-forming the anode electrode 40 is completed, but in this case, a separate mask process is added.

SUMMARY OF THE INVENTION

Accordingly, the present invention is directed to provide a top emission type organic light emitting display apparatus and a method of manufacturing the same that substantially obviate one or more problems due to limitations and disadvantages of the related art.

An advantage of the present invention is directed to a top emission type organic light emitting display apparatus and a method of manufacturing the same, in which the number of additional processes is minimized, and a signal pad is prevented from being corroded.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display apparatus in which an anode electrode, an organic emission layer, a cathode electrode, and an auxiliary electrode connected to the cathode electrode and disposed on the same layer as that of the anode electrode are disposed in an active area of the substrate, a signal pad and a pad electrode connected to the signal pad and covering a top of the signal pad are disposed in a pad area of the substrate, and a top of the pad electrode is lower in oxidation rate than the top of the signal pad.

In another aspect of the present invention, there is provided a method of manufacturing an organic light emitting display apparatus including: forming a source electrode, a drain electrode and a signal pad on a substrate; forming a passivation layer on the source electrode, the drain electrode and the signal pad; simultaneously forming a contact hole externally exposing the source electrode or the drain electrode, and a contact hole externally exposing the signal pad, by removing predetermined regions of the passivation layer; and forming an anode electrode connected to the source electrode or the drain electrode, an auxiliary electrode separated from the anode electrode, and a pad electrode connected to the signal pad to cover the exposed signal pad.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Figure 1:
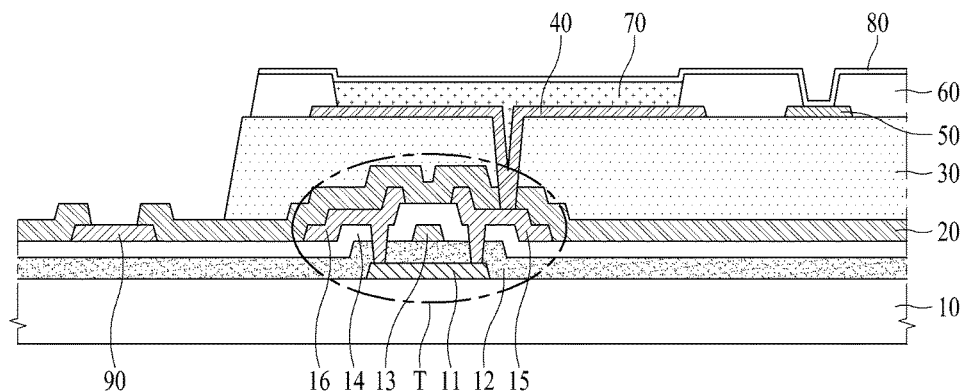
FIG. 1 is a schematic cross-sectional view of a related art top emission type organic light emitting display apparatus.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings.

Figure 2:
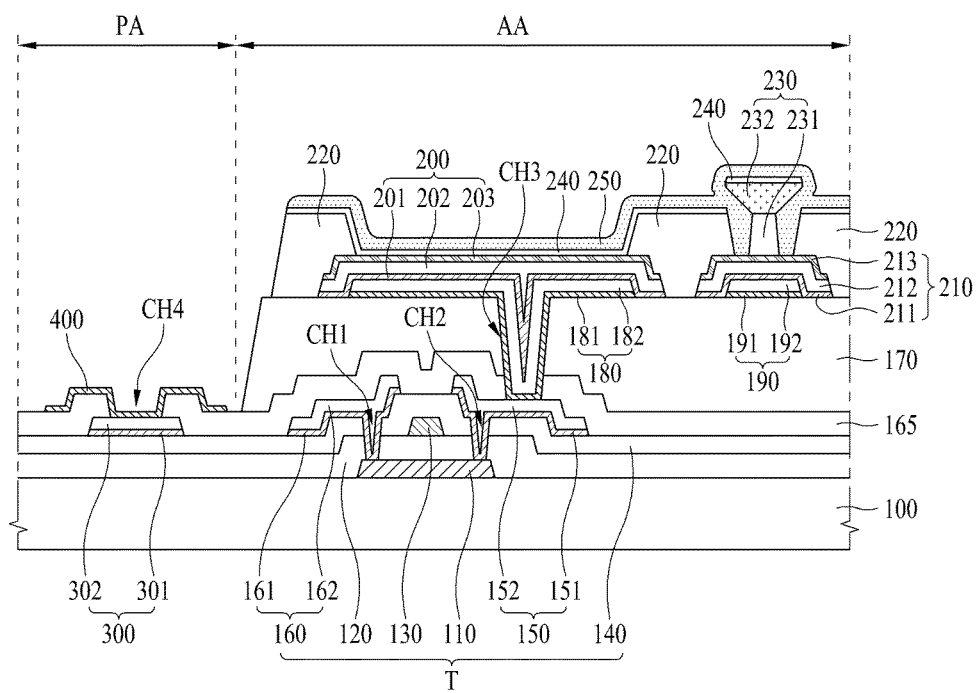
FIG. 2 is a cross-sectional view of an organic light emitting display apparatus according to an embodiment of the present invention.

FIG. 2 is a cross-sectional view of an organic light emitting display apparatus according to an embodiment of the present invention.

As illustrated in FIG. 2, the organic light emitting display apparatus according to an embodiment of the present invention may include an active area AA and a pad area PA provided on a substrate 100.

A thin film transistor (TFT) T, a passivation layer 165, a planarization layer 170, a first anode electrode 180, a second anode electrode 200, a first auxiliary electrode 190, a second auxiliary electrode 210, a bank 220, a partition wall 230, an organic emission layer 240, and a cathode electrode 250 formed in the active area AA on the substrate 100.

The TFT T may include an active layer 110, a gate insulation layer 120, a gate electrode 130, an interlayer dielectric 140, a source electrode 150, and a drain electrode 160.

The active layer 110 may be formed on the substrate 100 to overlap the gate electrode 130. The active layer 110 may be formed of a silicon-based semiconductor material, or may be formed of an oxide-based semiconductor material. Although not shown, a light shielding layer may be further formed between the substrate 100 and the active layer 110, and in this case, external light incident through a bottom of the substrate 100 is blocked by the light shielding layer, thereby preventing the active layer 110 from being damaged by the external light.

The gate insulation layer 120 may be formed on the active layer 110. The gate insulation layer 120 may insulate the active layer 110 from the gate electrode 130. The gate insulation layer 120 may be formed of an inorganic insulating material, for example, silicon oxide (SiOx), silicon nitride (SiNx), or a multilayer thereof, but is not limited thereto. The gate insulation layer 120 may extend to the pad area PA.

The gate electrode 130 may be formed on the gate insulation layer 120. The gate electrode 130 may be formed to overlap the active layer 110 with the gate insulation layer 120 therebetween. The gate electrode 130 may be formed of a single layer or a multilayer formed of one of molybdenum (Mo), aluminum (Al), chromium (Cr), gold (Au), titanium (Ti), nickel (Ni), neodymium (Nd), and copper (Cu) or an alloy thereof, but is not limited thereto.

The interlayer dielectric 140 may be formed on the gate electrode 130. The interlayer dielectric 140 may be formed of the same inorganic insulating material as that of the gate insulation layer 120, for example, silicon oxide (SiOx), silicon nitride (SiNx), or a multilayer thereof, but is not limited thereto. The interlayer dielectric 140 may extend to the pad area PA.

The source electrode 150 and the drain electrode 160 may be formed to face each other on the interlayer dielectric 140. A first contact hole CH1 exposing one end region of the active layer 110 and a second contact hole CH2 exposing the other end region of the active layer 110 may be provided in the gate insulation layer 120 and the interlayer dielectric 140. The source electrode 150 may be connected to the other end region of the active layer 110 through the second contact hole CH2, and the drain electrode 160 may be connected to the one end region of the active layer 110 through the first contact hole CH1.

The source electrode 150 may include a lower source electrode 151 and an upper source electrode 152.

The lower source electrode 151 may be formed between the interlayer dielectric 140 and the upper source electrode 152 and may enhance an adhesive force between the interlayer dielectric 140 and the upper source electrode 152. Also, the lower source electrode 151 protects a bottom of the upper source electrode 152, thereby preventing the bottom of the upper source electrode 152 from being corroded. Therefore, an oxidation rate of the lower source electrode 151 may be lower than that of the upper source electrode 152. That is, the lower source electrode 151 may be formed of a material which is stronger in corrosion resistance than a material forming the upper source electrode 152. As described above, the lower source electrode 151 may act as an adhesion enhancement layer or an anti-corrosion layer and may be formed of an alloy (MoTi) of Mo and Ti, but is not limited thereto.

The upper source electrode 152 may be formed on a top of the lower source electrode 151. The upper source electrode 152 may be formed of Cu which is metal having a low resistance, but is not limited thereto. The upper source electrode 152 may be formed of metal which is relatively lower in resistance than the lower source electrode 151. In order to lower a total resistance of the source electrode 150, a thickness of the upper source electrode 152 may be formed thicker than that of the lower source electrode 151.

Similar to the above-described source electrode 150, the drain electrode 160 may include a lower drain electrode 161 and an upper drain electrode 162.

The lower drain electrode 161 may be formed between the interlayer dielectric 140 and the upper drain electrode 162. The lower drain electrode 161 enhances an adhesive force between the interlayer dielectric 140 and the upper drain electrode 162 and moreover prevents a bottom of the upper drain electrode 162 from being corroded. Therefore, an oxidation rate of the lower drain electrode 161 may be lower than that of the upper drain electrode 162. That is, the lower drain electrode 161 may be formed of a material which is stronger in corrosion resistance than a material forming the upper drain electrode 162. As described above, the lower drain electrode 161 may be formed of an alloy (MoTi) of Mo and Ti which is the same as the above-described material of the lower source electrode 151, but is not limited thereto.

The upper drain electrode 162 may be formed on a top of the lower drain electrode 161 and may be formed of Cu which is the same as the above-described material of the upper source electrode 152, but is not limited thereto. A thickness of the upper drain electrode 162 may be formed thicker than that of the lower drain electrode 161, thereby lowering a total resistance of the drain electrode 160.

The upper drain electrode 162 may be formed of the same material as that of the upper source electrode 152 to have the same thickness as that of the upper source electrode 152, and the lower drain electrode 161 may be formed of the same material as that of the lower source electrode 151 to have the same thickness as that of the lower source electrode 151. In this case, the drain electrode 160 and the source electrode 150 may be simultaneously formed through the same process.

A structure of the TFT T is not limited to the illustrated structure, and may be variously modified to structures known to those skilled in the art. For example, a top gate structure where the gate electrode 130 is formed on the active layer 110 is illustrated in the drawing, but the TFT T may be formed in a bottom gate structure where the gate electrode 130 is formed under the active layer 110.

The passivation layer 165 may be formed on the TFT T, and in more detail, may be formed on tops of the source electrode 150 and the drain electrode 160. The passivation layer 165 protects the TFT T. The passivation layer 165 may be formed of an inorganic insulating material (for example, SiOx and SiNx), but is not limited thereto. The passivation layer 165 may extend to the pad area PA.

The planarization layer 170 may be formed on the passivation layer 165. The planarization layer 170 may planarize an upper surface of the substrate 100 including the TFT T. The planarization layer 170 may be formed of an organic insulating material such as acryl resin, epoxy resin, phenolic resin, polyamide resin, polyimide resin, or the like, but is not limited thereto. The planarization layer 170 may not extend to the pad area PA.

The first anode electrode 180 and the first auxiliary electrode 190 may be formed on the planarization layer 170. That is, the first anode electrode 180 and the first auxiliary electrode 190 may be formed on the same layer. A third contact hole CH3 exposing the source electrode 150 may be provided in the passivation layer 165 and the planarization layer 170, and the source electrode 150 may be connected to the first anode electrode 180 through the third contact hole CH3. In one or more embodiments, the first anode electrode 180 is connected with the source electrode 150. However, the source electrode 150 and the drain electrode 160 can be switched based on the mode of the transistor. Accordingly, in one or more embodiments, the first anode electrode 180 may be connected with the drain electrode 160 instead of the source electrode 150. As a result, the first anode electrode 180 may be connected with the source electrode 150 or the drain electrode 160.

The first anode electrode 180 may include a first lower anode electrode 181 and a first upper anode electrode 182.

The first lower anode electrode 181 may be formed between the planarization layer 170 and the first upper anode electrode 182 and may enhance an adhesive force between the planarization layer 170 and the first upper anode electrode 182. Also, the first lower anode electrode 181 protects a bottom of the first upper anode electrode 182, thereby preventing the bottom of the first upper anode electrode 182 from being corroded. Therefore, an oxidation rate of the first lower anode electrode 181 may be lower than that of the first upper anode electrode 182. That is, the first lower anode electrode 181 may be formed of a material which is stronger in corrosion resistance than a material forming the first upper anode electrode 182. Also, the first upper anode electrode 181 protects a top of the upper source electrode 152, thereby preventing the top of the upper source electrode 152 from being corroded. Therefore, an oxidation rate of the first lower anode electrode 181 may be lower than that of the upper source electrode 152. That is, the first lower anode electrode 181 may be formed of a material which is stronger in corrosion resistance than a material forming the upper source electrode 152. As described above, the first lower anode electrode 181 prevents the top of the upper source electrode 152 from being corroded, and thus, the source electrode 150 may be formed in the above-described two-layer structure. The first lower anode electrode 181 may act as an adhesion enhancement layer or an anti-corrosion layer and may be formed of an alloy (MoTi) of Mo and Ti, but is not limited thereto.

The first upper anode electrode 182 may be formed on a top of the first lower anode electrode 181. The first upper anode electrode 182 may be formed of Cu which is metal having a low resistance, but is not limited thereto. The first upper anode electrode 182 may be formed of metal which is relatively lower in resistance than the first lower anode electrode 181. In order to lower a total resistance of the first anode electrode 180, a thickness of the first upper anode electrode 182 may be formed thicker than that of the first lower anode electrode 181.

Similar to the above-described first anode electrode 180, the first auxiliary electrode 190 may include a first lower auxiliary electrode 191 and a first upper auxiliary electrode 192.

The first lower auxiliary electrode 191 may be formed between the planarization layer 170 and the first upper auxiliary electrode 192. The first lower auxiliary electrode 191 enhances an adhesive force between the planarization layer 170 and the first upper auxiliary electrode 192 and moreover prevents a bottom of the first upper auxiliary electrode 192 from being corroded. Therefore, an oxidation rate of the first lower auxiliary electrode 191 may be lower than that of the first upper auxiliary electrode 192. That is, the first lower auxiliary electrode 191 may be formed of a material which is stronger in corrosion resistance than a material forming the first upper auxiliary electrode 192. As described above, the first lower auxiliary electrode 191 may be formed of an alloy (MoTi) of Mo and Ti which is the same as the above-described material of the first lower anode electrode 181, but is not limited thereto.

The first upper auxiliary electrode 192 may be formed on a top of the first lower auxiliary electrode 191 and may be formed of Cu which is the same as the above-described material of the first upper anode electrode 182, but is not limited thereto. A thickness of the first upper auxiliary electrode 192 which is relatively low in resistance may be formed thicker than that of the first lower auxiliary electrode 191 which is relatively high in resistance, thereby lowering a total resistance of the first auxiliary electrode 190.

The first upper auxiliary electrode 192 may be formed of the same material as that of the first upper anode electrode 182 to have the same thickness as that of the first upper anode electrode 182, and the first lower auxiliary electrode 191 may be formed of the same material as that of the first lower anode electrode 181 to have the same thickness as that of the first lower anode electrode 181. In this case, the first auxiliary electrode 190 and the first anode electrode 180 may be simultaneously formed through the same process.

The second anode electrode 200 may be formed on a top of the first anode electrode 180. The second anode electrode 200 may be formed to contact a whole top and side surface of the first anode electrode 180. That is, a separate insulation layer may not be formed between the second anode electrode 200 and the first anode electrode 180. Thus, a process of forming an insulation layer and a contact hole is not needed. The second anode electrode 200 may reflect light, emitted from the organic emission layer 240, in an upward direction, and to this end, the second anode electrode 200 may be formed of a material having good reflectivity. Also, the second anode electrode 200 may be formed to cover the top and side surface of the first anode electrode 180 and prevents the top and side surface of the first anode electrode 180 from being corroded.

The second anode electrode 200 may include a second lower anode electrode 201, a second center anode electrode 202, and a second upper anode electrode 203.

The second lower anode electrode 201 may be formed between the first anode electrode 180 and the second center anode electrode 202. The second lower anode electrode 201 may be formed to cover a top and a side surface of the first anode electrode 180, thereby preventing the first anode electrode 180 from being corroded. To this end, an oxidation rate of the second lower anode electrode 201 may be lower than that of each of the first lower anode electrode 181 and the first upper anode electrode 182 which configure the first anode electrode 180. That is, the second lower anode electrode 201 may be formed of a material which is stronger in corrosion resistance than a material forming the first lower anode electrode 181 and the first upper anode electrode 182. Also, the second lower anode electrode 201 protects a bottom of the second center anode electrode 202, thereby preventing the bottom of the second center anode electrode 202 from being corroded. To this end, an oxidation rate of the second lower anode electrode 201 may be lower than that of the second center anode electrode 202. That is, the second lower anode electrode 201 may be formed of a material which is stronger in corrosion resistance than a material forming the second center anode electrode 202. The second lower anode electrode 201 may be formed of a transparent conductive material such as indium tin oxide (ITO) or the like, but is not limited thereto.

The second center anode electrode 202 may be formed between the second lower anode electrode 201 and the second upper anode electrode 203. The second center anode electrode 202 may be formed of a material which is lower in resistance than and better in reflectivity than the second lower anode electrode 201 and the second upper anode electrode 203, and for example, may be formed of silver (Ag). However, the present embodiment is not limited thereto. A thickness of the second center anode electrode 202 which is relatively low in resistance may be formed thicker than that of each of the second lower anode electrode 201 and the second upper anode electrode 203 which are relatively high in resistance, thereby lowering a total resistance of the second anode electrode 200.

The second upper anode electrode 203 may be formed on a top of the second center anode electrode 202, thereby preventing the top of the second center anode electrode 202 from being corroded. To this end, an oxidation rate of the second upper anode electrode 203 may be lower than that of the second center anode electrode 202. That is, the second upper anode electrode 203 may be formed of a material which is stronger in corrosion resistance than a material forming the second center anode electrode 202. The second upper anode electrode 203 may be formed of a transparent conductive material such as ITO or the like, but is not limited thereto.

The second auxiliary electrode 210 may be formed on a top of the first auxiliary electrode 190. The second auxiliary electrode 210 may be formed on the same layer as a layer on which the second anode electrode 200 is disposed. The second auxiliary electrode 210 may be formed to contact a whole top and side surface of the first auxiliary electrode 190. That is, a separate insulation layer may not be formed between the second auxiliary electrode 210 and the first auxiliary electrode 190, and thus, a process of forming an insulation layer and a contact hole is not needed. The second auxiliary electrode 210 lowers a resistance of the cathode electrode 250 along with the first auxiliary electrode 190. According to an embodiment of the present invention, two auxiliary electrodes (for example, the first and second auxiliary electrodes 190 and 210) may be stack-formed for lowering the resistance of the cathode electrode 250, and thus, the desired resistance characteristic of the auxiliary electrodes is more easily adjusted. To provide a more detailed description, since the first auxiliary electrode 190 is formed on the same layer as a layer on which the first anode electrode 180 is formed, there is a limitation in increasing a size of the first auxiliary electrode 190. Therefore, according to an embodiment of the present invention, the second auxiliary electrode 210 may be stacked on the first auxiliary electrode 190, and thus, the resistance of the cathode electrode 150 is effectively lowered. Also, the second auxiliary electrode 210 may be formed to cover the top and side surface of the first auxiliary electrode 190, thereby preventing the top and side surface of the first auxiliary electrode 190 from being corroded.

The second auxiliary electrode 210 may include a second lower auxiliary electrode 211, a second center auxiliary electrode 212, and a second upper auxiliary electrode 213.

The second lower auxiliary electrode 211 may be formed between the first auxiliary electrode 190 and the second center auxiliary electrode 212. The second lower auxiliary electrode 211 may be formed to cover a top and a side surface of the first auxiliary electrode 190, thereby preventing the first auxiliary electrode 190 from being corroded. To this end, an oxidation rate of the second lower auxiliary electrode 211 may be lower than that of each of the first lower auxiliary electrode 191 and the first upper auxiliary electrode 192 which configure the first auxiliary electrode 190. That is, the second lower auxiliary electrode 211 may be formed of a material which is stronger in corrosion resistance than a material forming the first lower auxiliary electrode 191 and the first upper auxiliary electrode 192. Also, the second lower auxiliary electrode 211 protects a bottom of the second center auxiliary electrode 212, thereby preventing the bottom of the second center auxiliary electrode 212 from being corroded. To this end, an oxidation rate of the second lower auxiliary electrode 211 may be lower than that of the second center auxiliary electrode 212. That is, the second lower auxiliary electrode 211 may be formed of a material which is stronger in corrosion resistance than a material forming the second center auxiliary electrode 212. The second lower auxiliary electrode 211 may be formed of a transparent conductive material such as ITO or the like, but is not limited thereto.

The second center auxiliary electrode 212 may be formed between the second lower auxiliary electrode 211 and the second upper auxiliary electrode 213. The second center auxiliary electrode 212 may be formed of a material which is lower in resistance than and better in reflectivity than the second lower auxiliary electrode 211 and the second upper auxiliary electrode 213, and for example, may be formed of silver (Ag). However, the present embodiment is not limited thereto. A thickness of the second center auxiliary electrode 212 which is relatively low in resistance may be formed thicker than that of each of the second lower auxiliary electrode 211 and the second upper auxiliary electrode 213 which are relatively high in resistance, thereby lowering a total resistance of the second auxiliary electrode 210.

The second upper auxiliary electrode 213 may be formed on a top of the second center auxiliary electrode 212, thereby preventing the top of the second center auxiliary electrode 212 from being corroded. To this end, an oxidation rate of the second upper auxiliary electrode 213 may be lower than that of the second center auxiliary electrode 212. That is, the second upper auxiliary electrode 213 may be formed of a material which is stronger in corrosion resistance than a material forming the second center auxiliary electrode 212. The second upper auxiliary electrode 213 may be formed of a transparent conductive material such as ITO or the like, but is not limited thereto.

The second upper auxiliary electrode 213 may be formed of the same material as that of the second upper anode electrode 203 to have the same thickness as that of the second upper anode electrode 203, the second center auxiliary electrode 212 may be formed of the same material as that of the second center anode electrode 202 to have the same thickness as that of the second center anode electrode 202, and the second lower auxiliary electrode 211 may be formed of the same material as that of the second lower anode electrode 201 to have the same thickness as that of the second lower anode electrode 201. In this case, the second auxiliary electrode 210 and the second anode electrode 200 may be simultaneously formed through the same process.

The bank 220 may be formed on the second anode electrode 200 and the second auxiliary electrode 210.

The bank 220 may be formed on one side and the other side of the second anode electrode 200 to expose a top of the second anode electrode 200. Since the bank 220 is formed to expose the top of the second anode electrode 200, an area where an image is displayed is secured. Also, since the bank 220 is formed on the one side and the other side of the second anode electrode 200, a side of the second center anode electrode 202 vulnerable to corrosion is prevented from being exposed to the outside, thereby preventing the side of the second center anode electrode 202 from being corroded.

The bank 220 may be formed on one side and the other side of the second auxiliary electrode 210 to expose a top of the second auxiliary electrode 210. Since the bank 220 is formed to expose the top of the second auxiliary electrode 210, an electrical connection space between the second auxiliary electrode 210 and the cathode electrode 250 is secured. Also, since the bank 220 is formed on the one side and the other side of the second auxiliary electrode 210, a side of the second center auxiliary electrode 212 vulnerable to corrosion is prevented from being exposed to the outside, thereby preventing the side of the second center auxiliary electrode 212 from being corroded.

Moreover, the bank 220 may be formed between the second anode electrode 200 and the second auxiliary electrode 210 and may insulate the second anode electrode 200 from the second auxiliary electrode 210. The bank 220 may be formed of an organic insulating material such as polyimide resin, acryl resin, benzocyclobutene (BCB), or the like, but is not limited thereto.

The partition wall 230 may be formed on the second auxiliary electrode 210. The partition wall 230 may be separated from the bank 220 by a certain distance, and the second auxiliary electrode 210 may be electrically connected to the cathode electrode 250 through a separation space between the partition wall 230 and the bank 220. The second auxiliary electrode 210 may be electrically connected to the cathode electrode 250 without forming the partition wall 230. However, if the partition wall 230 is formed, the organic emission layer 240 is more easily deposition-formed. This will be described below in more detail.

If the partition wall 230 is not formed, a mask pattern which covers a top of the second auxiliary electrode 210 is needed to deposit the organic emission layer 240 so that the top of the second auxiliary electrode 210 is not covered by the organic emission layer 240. However, if the partition wall 230 is formed, a top of the partition wall 230 may act as eaves in depositing the organic emission layer 240. Thus, since the organic emission layer 240 is not deposited under the eaves, a mask pattern to cover the top of the second auxiliary electrode 210 is not needed. That is, with respect to a case where the organic light emitting display apparatus is seen from the front thereof, when the top of the partition wall 230 that acts as eaves is formed to cover a separation space between the partition wall 230 and the bank 220, the organic emission layer 240 cannot penetrate into the separation space between the partition wall 230 and the bank 220. Thus, the second auxiliary electrode 210 may be exposed in the separation space between the partition wall 230 and the bank 220. Particularly, the organic emission layer 240 may be formed by a deposition process such as an evaporation process which is excellent in straightness of a deposited material. Thus, the organic emission layer 240 is not deposited in the separation space between the partition wall 230 and the bank 220.

As described above, a width of the top of the partition wall 230 may be formed greater than that of a bottom of the partition wall 230, in order for the top of the partition wall 230 to act as eaves. The partition wall 230 may include a lower first partition wall 231 and an upper second partition wall 232. The lower first partition wall 231 may be formed on a top of the second auxiliary electrode 210 and may be formed of the same material as that of the bank 220 through the same process as that of the bank 220. The upper second partition wall 232 may be formed on a top of the lower first partition wall 231. A width of a top of the upper second partition wall 232 may be formed greater than that of a bottom of the upper second partition wall 232. More specifically, the top of the upper second partition wall 232 may be formed to cover the separation space between the partition wall 230 and the bank 220 and may act as eaves.

The organic emission layer 240 may be formed on the second anode electrode 200. The organic emission layer 240 may include a hole injection layer, a hole transport layer, an emission layer, an electron transport layer, and an electron injection layer. The organic emission layer 240 may be modified to have various structures known to those skilled in the art.

The organic emission layer 240 may extend to the top of the bank 220. However, the organic emission layer 240 may not extend to the top of the second auxiliary electrode 210 in a state of covering the top of the second auxiliary electrode 210. This is because when the organic emission layer 240 covers the top of the second auxiliary electrode 210, it is difficult to electrically connect the second auxiliary electrode 210 to the cathode electrode 250. As described above, the organic emission layer 240 may be formed by a deposition process without a mask that covers the top of the second auxiliary electrode 210, and in this case, the organic emission layer 240 may be formed on the top of the partition wall 230.

The cathode electrode 250 may be formed on the organic emission layer 240. The cathode electrode 250 may be formed on a surface from which light is emitted, and thus may be formed of a transparent conductive material. Since the cathode electrode 250 is formed of a transparent conductive material, a resistance of the cathode electrode 250 is high, and for this reason, in order to lower the resistance of the cathode electrode 250, the cathode electrode 250 may be connected to the second auxiliary electrode 210. That is, the cathode electrode 250 may be connected to the second auxiliary electrode 210 via the separation space between the partition wall 230 and the bank 220. The cathode electrode 250 may be formed by a deposition process such as a sputtering process which is not good in straightness of a deposited material. Thus, the cathode electrode 250 may be deposited in the separation space between the partition wall 230 and the bank 220 in a process of depositing the cathode electrode 250.

Although not shown, an encapsulation layer may be further formed on the cathode electrode 250 and prevents penetration of water. The encapsulation layer may use various materials known to those skilled in the art. Also, although not shown, a color filter may be further formed for each pixel and on the cathode electrode 250, and in this case, white light may be emitted from the organic emission layer 240.

The gate insulation layer 120, the interlayer dielectric 140, the signal pad 300, the passivation layer 165, and the pad electrode 400 may be formed in the pad area PA on the substrate 100.

The gate insulation layer 120 may be formed on the substrate 100, and the interlayer dielectric 140 may be formed on the gate insulation layer 120. The gate insulation layer 120 and the interlayer dielectric 140 may be formed all over the pad area PA by extending from the active area AA.

The signal pad 300 may be formed on the interlayer dielectric 140. The signal pad 300 may be formed on the same layer as a layer where the source electrode 150 and the drain electrode 160 in the active area AA are disposed.

The signal pad 300 may include a lower signal pad 301 and an upper signal pad 302.

The lower signal pad 301 may be formed between the interlayer dielectric 140 and the upper signal pad 302 and may enhance an adhesive force between the interlayer dielectric 140 and the upper signal pad 302. Also, the lower signal pad 301 prevents a bottom of the upper signal pad 302 from being corroded. Therefore, an oxidation rate of the lower signal pad 301 may be lower than that of the upper signal pad 302. That is, the lower signal pad 301 may be formed of a material which is stronger in corrosion resistance than a material forming the upper signal pad 302. As described above, the lower signal pad 301 may be formed of an alloy (MoTi) of Mo and Ti which is the same as the above-described material of the lower source electrode 151 or the lower drain electrode 161, but is not limited thereto.

The upper signal pad 302 may be formed on a top of the lower signal pad 301. The upper signal pad 302 may be formed of Cu which is metal having a low resistance, but is not limited thereto. The upper signal pad 302 may be formed of metal which is relatively lower in resistance than the lower signal pad 301. In order to lower a total resistance of the signal pad 300, a thickness of the upper signal pad 302 may be formed thicker than that of the lower signal pad 301.

The upper signal pad 302 may be formed of the same material as that of the upper source electrode 152 and/or the upper drain electrode 162 to have the same thickness as that of the upper source electrode 152 and/or the upper drain electrode 162, and the lower signal pad 301 may be formed of the same material as that of the lower source electrode 151 and/or the lower drain electrode 161 to have the same thickness as that of the lower source electrode 151 and/or the lower drain electrode 161. In this case, the signal pad 300 and the source electrode 150, the signal pad 300 and the drain electrode 160 or the signal pad 300, the source electrode 150, and the drain electrode 160 may be simultaneously formed through the same process.

The passivation layer 165 may be formed on the signal pad 300. The passivation layer 165 may extend from the active area AA. A fourth contact hole CH4 exposing a portion of the signal pad 300 may be provided in the passivation layer 165.

The pad electrode 400 may be formed on the passivation layer 165. The pad electrode 400 may be connected to the signal pad 300 through the fourth contact hole CH4. The pad electrode 400 may be exposed to the outside and connected to an external driver.

The pad electrode 400 protects a top of the signal pad 300. The top of the signal pad 300 may be configured by the upper signal pad 302 which is relatively vulnerable to corrosion, and thus, the pad electrode 400 may be formed to cover the top of the upper signal pad 302 exposed through the fourth contact hole CH4, thereby preventing the upper signal pad 302 from being corroded. As described above, since the pad electrode 400 prevents the top of the upper signal pad 302 from being corroded, the signal pad 300 may be formed in the above-described two-layer structure. An oxidation rate of the pad electrode 400 may be lower than that of the upper signal pad 302. That is, the pad electrode 400 may be formed of a material which is stronger in corrosion resistance than a material forming the upper signal pad 302. Also, since the pad electrode 400 is exposed to the outside, the pad electrode 400 may be formed of a material which is strong in corrosion resistance. The pad electrode 400 may be formed of an alloy (MoTi) of Mo and Ti which is the same as the above-described material of the first lower anode electrode 181 and/or the first lower auxiliary electrode 191, but is not limited thereto. The pad electrode 400 may be formed of the same material as that of the first lower anode electrode 181 and/or the first lower auxiliary electrode 191 to have the same thickness as that of the first lower anode electrode 181 and/or the first lower auxiliary electrode 191. In this case, the pad electrode 400 and the first lower anode electrode 181, or the pad electrode 400 and the first lower auxiliary electrode 191, or the pad electrode 400, the first lower anode electrode 181, and the first lower auxiliary electrode 191 may be pattern-formed through the same mask process, and thus, a separate process is not added.

Figure 3:
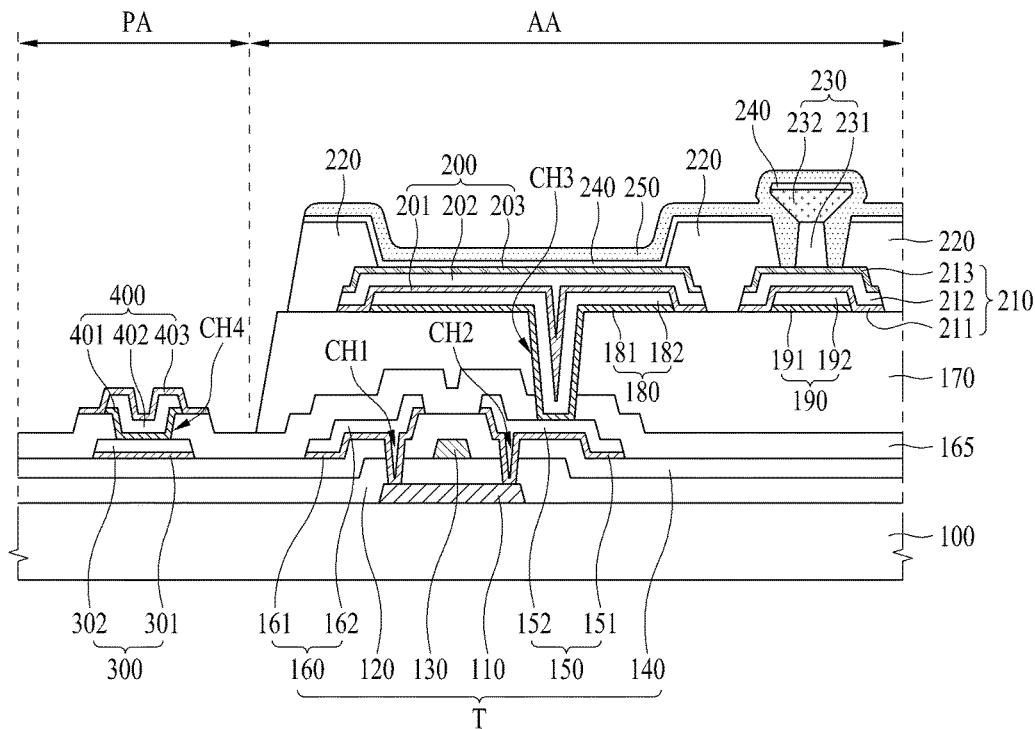
FIG. 3 is a cross-sectional view of an organic light emitting display apparatus according to another embodiment of the present invention.

FIG. 3 is a cross-sectional view of an organic light emitting display apparatus according to another embodiment of the present invention. A structure of a pad electrode 400 is changed from that of FIG. 2. Otherwise, the organic light emitting display apparatus of FIG. 3 is the same as the above-described organic light emitting display apparatus of FIG. 2. Thus, like reference numerals refer to like elements.

Hereinafter, only elements different from the above-described elements of FIG. 2 will be described in detail.

As illustrated in FIG. 3, according to another embodiment of the present invention, a pad electrode 400 may include a lower pad electrode 401, an upper pad electrode 402, and a cover pad electrode 403.

The lower pad electrode 401 may be formed to cover a top of the upper signal pad 302 exposed through the fourth contact hole CH4 and prevents the upper signal pad 302 from being corroded. To this end, an oxidation rate of the lower pad electrode 401 may be lower than that of the upper signal pad 302. That is, the lower pad electrode 401 may be formed of a material which is stronger in corrosion resistance than a material forming the upper signal pad 302. As described above, since the lower pad electrode 401 prevents the top of the upper signal pad 302 from being corroded, the signal pad 300 may be formed in the above-described two-layer structure. The lower pad electrode 401 may be formed of an alloy (MoTi) of Mo and Ti which is the same as the above-described material of the first lower anode electrode 181 and/or the first lower auxiliary electrode 191, but is not limited thereto. The lower pad electrode 401 may be formed of the same material as that of the first lower anode electrode 181 and/or the first lower auxiliary electrode 191 to have the same thickness as that of the first lower anode electrode 181 and/or the first lower auxiliary electrode 191. In this case, the lower pad electrode 401 and the first lower anode electrode 181, the lower pad electrode 401 and the first lower auxiliary electrode 191, or the lower pad electrode 401, the first lower anode electrode 181, and the first lower auxiliary electrode 191 may be pattern-formed through the same mask process.

The upper pad electrode 402 may be formed between the lower pad electrode 401 and the cover pad electrode 403. The upper pad electrode 402 may be formed of Cu which is a metal having a low resistance, but is not limited thereto. The upper pad electrode 402 may be formed of a metal which is relatively lower in resistance than the lower pad electrode 401 and the cover pad electrode 403. In order to lower a total resistance of the pad electrode 400, a thickness of the upper pad electrode 402 may be formed thicker than that of each of the lower pad electrode 401 and the cover pad electrode 403. The upper pad electrode 402 may be formed of the same material as that of the first upper anode electrode 182 and/or the first upper auxiliary electrode 192 to have the same thickness as that of the first upper anode electrode 182 and/or the first upper auxiliary electrode 192. In this case, the upper pad electrode 402 and the first upper anode electrode 182, the upper pad electrode 402 and the first upper auxiliary electrode 192, or the upper pad electrode 402, the first upper anode electrode 182, and the first upper auxiliary electrode 192 may be pattern-formed through the same process.

The cover pad electrode 403 may be formed on the upper pad electrode 402. The cover pad electrode 403 may be formed to cover a top and a side surface of the upper pad electrode 402, thereby preventing the upper pad electrode 402 from being corroded. That is, the cover pad electrode 403 prevents the upper pad electrode 402 from being exposed to the outside. To this end, an oxidation rate of the cover pad electrode 403 may be lower than that of the upper pad electrode 402. That is, the cover pad electrode 403 may be formed of a material which is stronger in corrosion resistance than a material forming the upper pad electrode 402.

The cover pad electrode 403 may cover up to a side surface of the lower pad electrode 401. In this case, an oxidation rate of the cover pad electrode 403 may be lower than that of the lower pad electrode 401. That is, the cover pad electrode 403 may be formed of a material which is stronger in corrosion resistance than a material forming the lower pad electrode 401. The cover pad electrode 403 may be formed of a transparent conductive material such as ITO or the like, but is not limited thereto. The cover pad electrode 403 may be formed of the same material as that of the second lower anode electrode 201 and/or the second lower auxiliary electrode 211 to have the same thickness as that of the second lower anode electrode 201 and/or the second lower auxiliary electrode 211. In this case, the cover pad electrode 403 and the second lower anode electrode 201, the cover pad electrode 403 and the second lower auxiliary electrode 211, the cover pad electrode 403, the second lower anode electrode 201, and the second lower auxiliary electrode 211 may be pattern-formed through the same mask process.

FIGS. 4A to 4H are cross-sectional views illustrating a method of manufacturing an organic light emitting display apparatus according to an embodiment of the present invention and relate to a method of manufacturing the above-described organic light emitting display apparatus of FIG. 2. Thus, like reference numerals refer to like elements, and in a material and a structure of each element, the same or similar descriptions are not repeated.

Figure 4A:
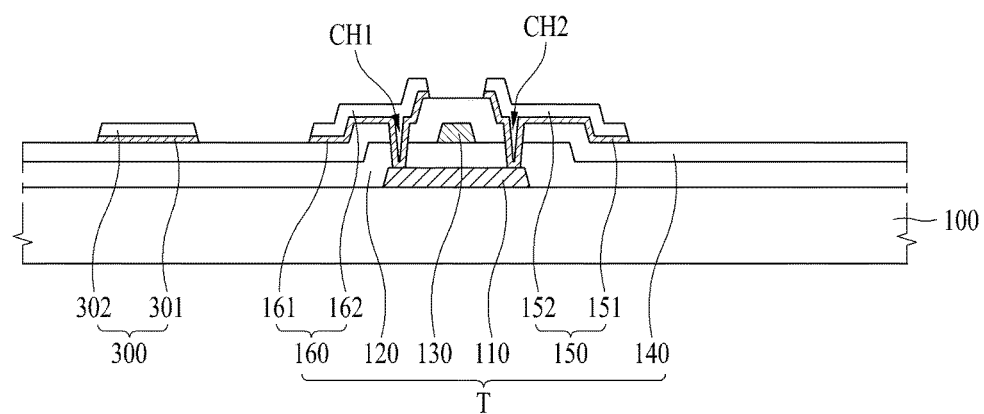
FIGS. 4A to 4H are cross-sectional views illustrating a method of manufacturing an organic light emitting display apparatus according to an embodiment of the present invention.

First, as illustrated in FIG. 4A, an active layer 110, a gate insulation layer 120, a gate electrode 130, an interlayer dielectric 140, a source electrode 150, a drain electrode 160, and a signal pad 300 may be sequentially formed on a substrate 100.

To provide a more detailed description, the active layer 110 may be formed on the substrate 100, the gate insulation layer 120 may be formed on the active layer 110, the gate electrode 130 may be formed on the gate insulation layer 120, the interlayer dielectric 140 may be formed on the gate electrode 130, and a first contact hole CH1 and a second contact hole CH2 may be formed in the gate insulation layer 120 and the interlayer dielectric 140. Subsequently, the drain electrode 160 which is connected to one end region of the active layer 110 through the first contact hole CH1, the source electrode 150 which is connected to the other end region of the active layer 110 through the second contact hole CH2, and the signal pad 300 may be formed.

The active layer 110, the gate electrode 130, the source electrode 150, and the drain electrode 160 may be formed in an active area AA. The gate insulation layer 120 and the interlayer dielectric 140 may be formed to extend from the active area AA to a pad area PA, and the signal pad 300 may be formed in the pad area AA. Through such a process, a TFT T may be formed in the active area AA, and the signal pad 300 may be formed in the pad area PA.

The source electrode 150 may be configured with a lower source electrode 151 and an upper source electrode 152. The drain electrode 160 may be configured with a lower drain electrode 161 and an upper drain electrode 162. And, the signal pad 300 may be configured with a lower signal pad 301 and an upper signal pad 302. The source electrode 150, the drain electrode 160, and the signal pad 300 may be simultaneously formed of the same material by the same patterning process.

Figure 4B:
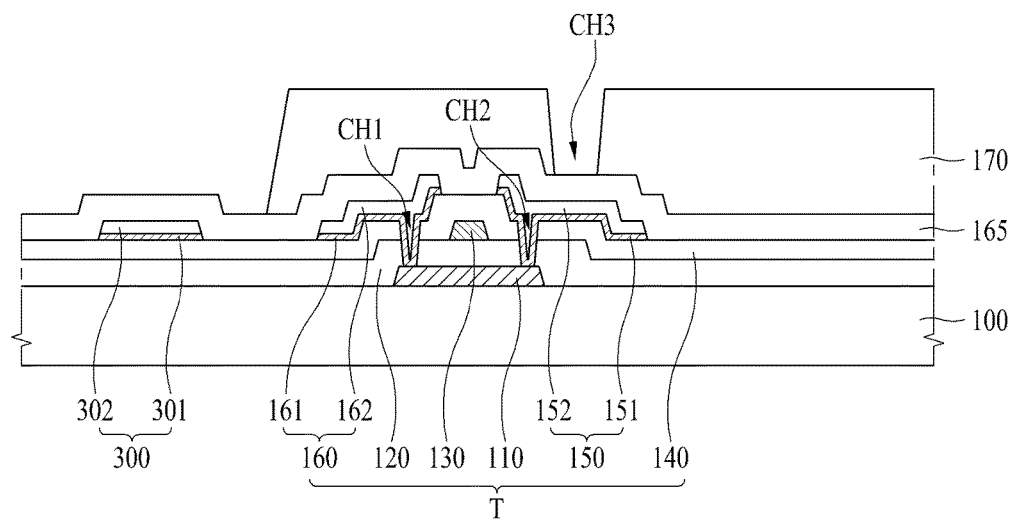

Subsequently, as illustrated in FIG. 4B, a passivation layer 165 may be formed on the source electrode 150, the drain electrode 160, and the signal pad 300, and a planarization layer 170 may be formed on the passivation layer 165. The planarization layer 170 may include a third contact hole CH3.

The passivation layer 165 may be formed to extend from the active area AA to the pad area PA, and the planarization layer 170 may be formed in the active area AA. Since a TFT is not formed in the pad area PA, the necessity for planarizing a surface of the pad area PA is small, and thus, the planarization layer 170 may not be formed in the pad area PA.

Figure 4C:
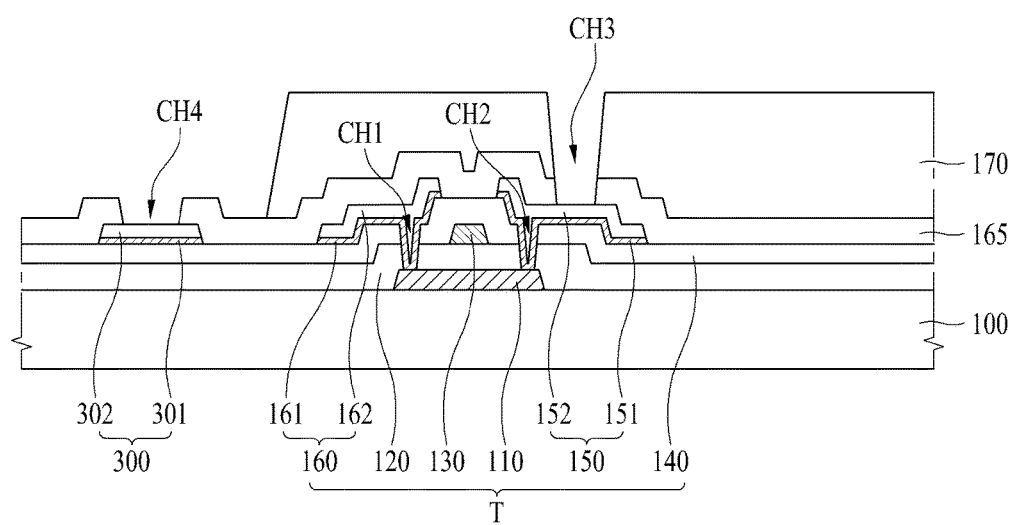

Subsequently, as illustrated in FIG. 4C, by removing partial regions of the passivation layer 165, a third contact hole CH3 and a fourth contact hole CH4 may be formed in the passivation layer 165. The source electrode 150 may be exposed to the outside by the third contact hole CH3 which is included in the passivation layer 165 and the planarization layer 170, and the signal pad 300 may be exposed to the outside by the fourth contact hole CH4 included in the passivation layer 165. According to an embodiment of the present invention, the third contact hole CH3 of the passivation layer 165 for externally exposing the source electrode 150 and the fourth contact hole CH4 of the passivation layer 165 for externally exposing the signal pad 300 may be simultaneously formed. Thus, the third contact hole CH3 and the fourth contact hole CH4 may be formed through one mask process, thereby preventing the number of mask processes from increasing. To provide a more detailed description, since the upper signal pad 302 exposed by the fourth contact hole CH4 is vulnerable to corrosion, it is required for an etchant not to be brought in contact with the upper signal pad 302. According to an embodiment of the present invention, the exposed upper signal pad 302 may be covered by a lower pad electrode 401 in a process of FIG. 4D to be described below. Thus, the etchant does not contact the upper signal pad 302. For the same reason as this, the fourth contact CH4 and the third contact hole CH3 may be simultaneously formed. In another embodiment, instead of the source electrode 150, the drain electrode 160 may be exposed to the outside by a third contact hole CH3 which is included in the passivation layer 165 and the planarization layer 170.

Figure 4D:
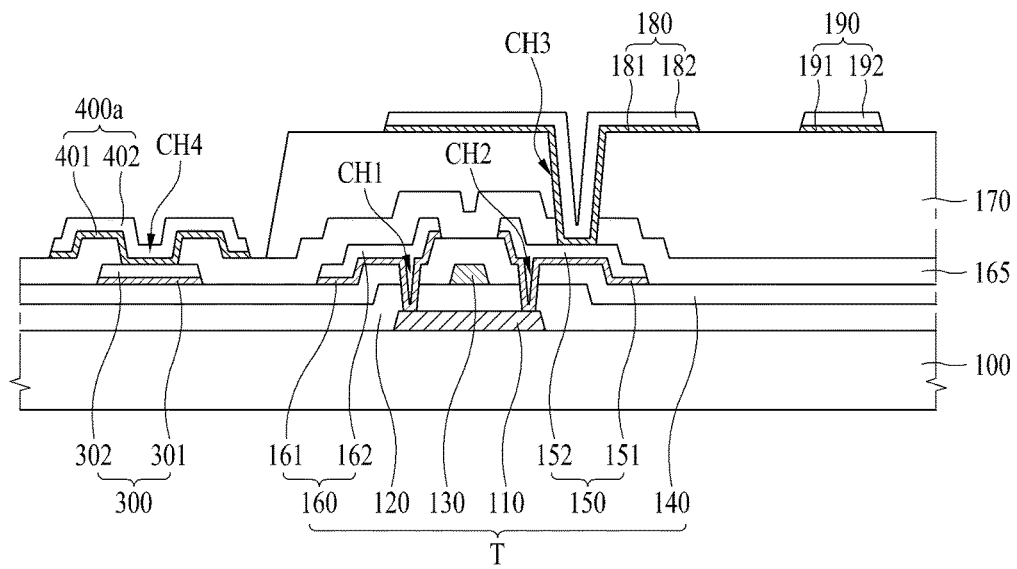

Subsequently, as illustrated in FIG. 4D, a first anode electrode 180 and a first auxiliary electrode 190 may be formed to be separated from each other on the planarization layer 170 in the active area AA, and a first pad electrode 400a may be formed on the passivation layer 165 in the pad area PA.

The first anode electrode 180 may be formed to be connected to the source electrode 150 through the third contact hole CH3, and the first pad electrode 400a may be formed to be connected to the signal pad 300 through the fourth contact hole CH4.

The first anode electrode 180 may be configured with a first lower anode electrode 181 and a first upper anode electrode 182, and the first auxiliary electrode 190 may be configured with a first lower auxiliary electrode 191 and a first upper auxiliary electrode 192. The first pad electrode 400a may be configured with a lower pad electrode 401 and an upper pad electrode 402.

The first anode electrode 180, the first auxiliary electrode 190, and the first pad electrode 400a may be simultaneously formed of the same material through the same patterning process.

Figure 4E:
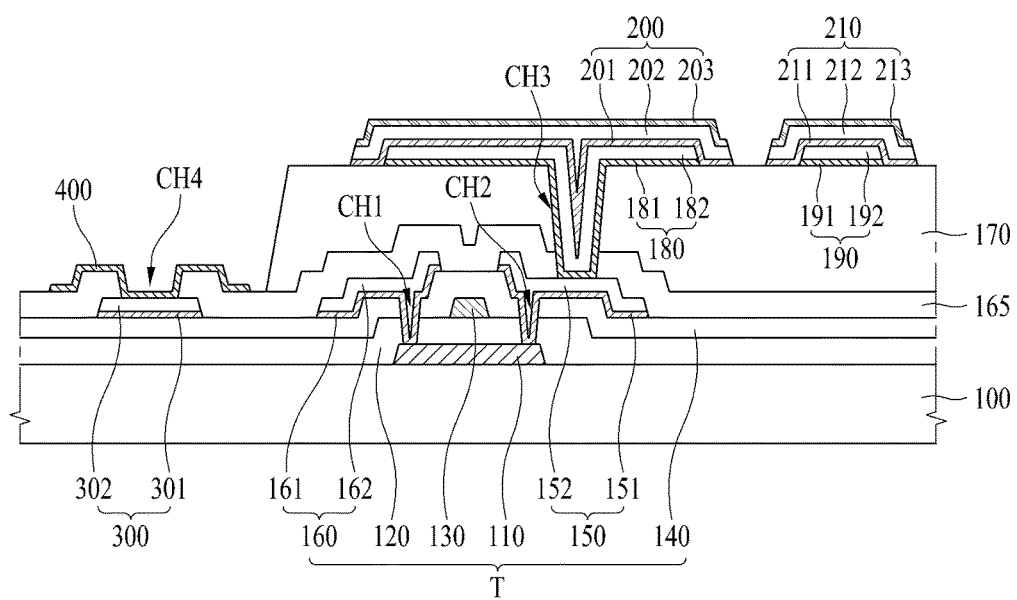

Subsequently, as illustrated in FIG. 4E, a second anode electrode 200 may be formed on a first anode electrode 180 in the active area AA, and a second auxiliary electrode 210 may be formed on a first auxiliary electrode 190 in the active area AA.

The second anode electrode 200 may be pattern-formed to cover a top and a side surface of the first anode electrode 180, and the second auxiliary electrode 210 may be pattern-formed to cove a top and a side surface of the first auxiliary electrode 190. The second anode electrode 200 and the second auxiliary electrode 210 may be simultaneously formed of the same material through the same patterning process.

The second anode electrode 200 may include a second lower anode electrode 201, a second center anode electrode 202, and a second upper anode electrode 203. The second auxiliary electrode 210 may include a second lower auxiliary electrode 211, a second center auxiliary electrode 212, and a second upper auxiliary electrode 213.

A process of pattern-forming the second anode electrode 200 and the second auxiliary electrode 210 may include an etching process using an etchant. An upper pad electrode 402 formed in the pad area PA may be etched together in the etching process, and thus, a manufacturing process is simplified. That is, the upper pad electrode 402 may be removed in the process of pattern-forming the second anode electrode 200 and the second auxiliary electrode 210, and thus, a pad electrode 400 including only the lower pad electrode 401 may be finished. Since the upper pad electrode 402 is formed of a material vulnerable to corrosion, the pad electrode 400 including only the lower pad electrode 401 which is excellent in corrosion resistance may be obtained by removing the upper pad electrode 402.

Figure 4F:
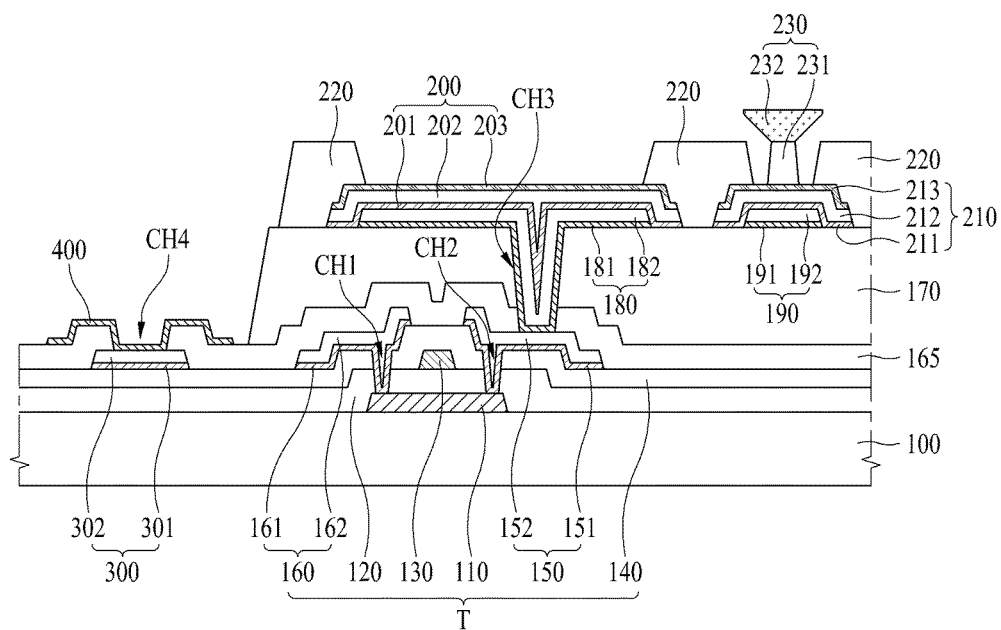

Subsequently, as illustrated in FIG. 4F, a bank 220 may be formed on one side and the other side of the second anode electrode 200 to expose a top of the second anode electrode 200. Also, the bank 220 may be formed on one side and the other side of the second auxiliary electrode 210 to expose a top of the second auxiliary electrode 210.

Moreover, a first partition wall 231 and a second partition wall 232 may be sequentially formed on the exposed top of the second auxiliary electrode 210. The first partition wall 231 may be formed of the same material as that of the bank 220 through the same pattern forming process as that of the bank 220 simultaneously with the bank 220. The partition wall 230 may be formed to be separated from the bank 220 by a certain distance. Thus, a separation space may be provided between the partition wall 230 and the bank 220.

In order for a top of the partition wall 230 to act as eaves, a width of a top of the second partition wall 232 may be formed greater than that of a bottom of the second partition wall 232. Particularly, with respect to a case where the organic light emitting display apparatus is seen from the front thereof, the top of the second partition wall 232 may cover the separation space between the partition wall 230 and the bank 220, and thus, in a below-described process of depositing an organic emission layer 240, the organic emission layer 240 is not deposited in the separation space between the partition wall 230 and the bank 220.

Figure 4G:
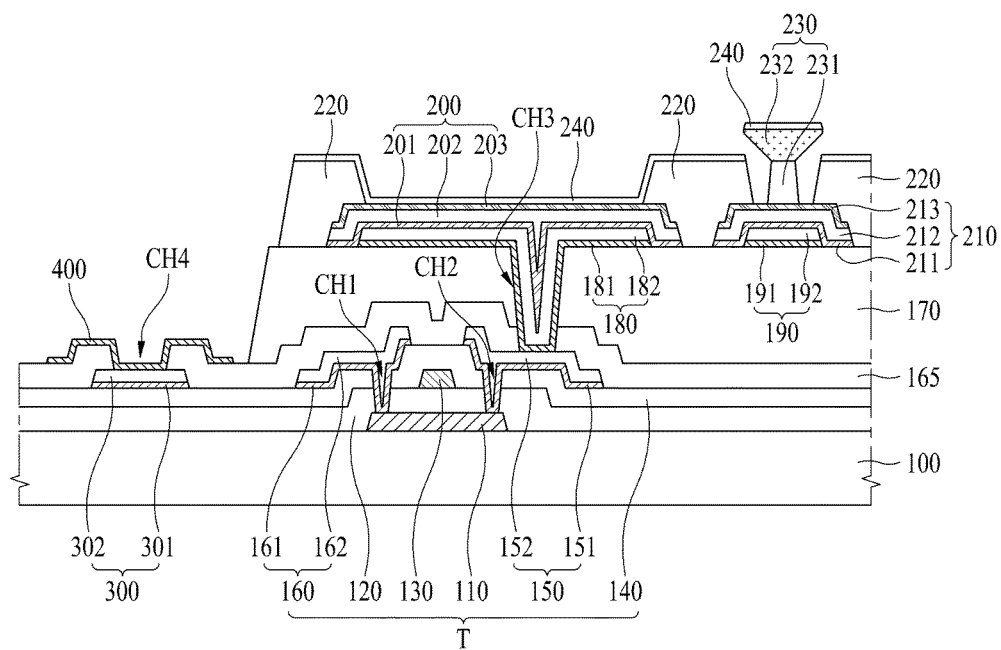

Subsequently, as illustrated in FIG. 4G, the organic emission layer 240 may be formed on the second anode electrode 200. The organic emission layer 240 may be formed by a deposition process such as an evaporation process which is excellent in straightness of a deposited material, and thus, the organic emission layer 240 may be deposited on tops of the bank 220 and the partition wall 230, but the organic emission layer 240 is not deposited in the separation space between the partition wall 230 and the bank 220. That is, the top of the partition wall 230 may act as eaves in depositing the organic emission layer 240, and thus, even when the organic emission layer 240 is deposited without a mask pattern which covers the top of the second auxiliary electrode 210, the organic emission layer 240 is not deposited in the separation space between the partition wall 230 and the bank 220.

Figure 4H:
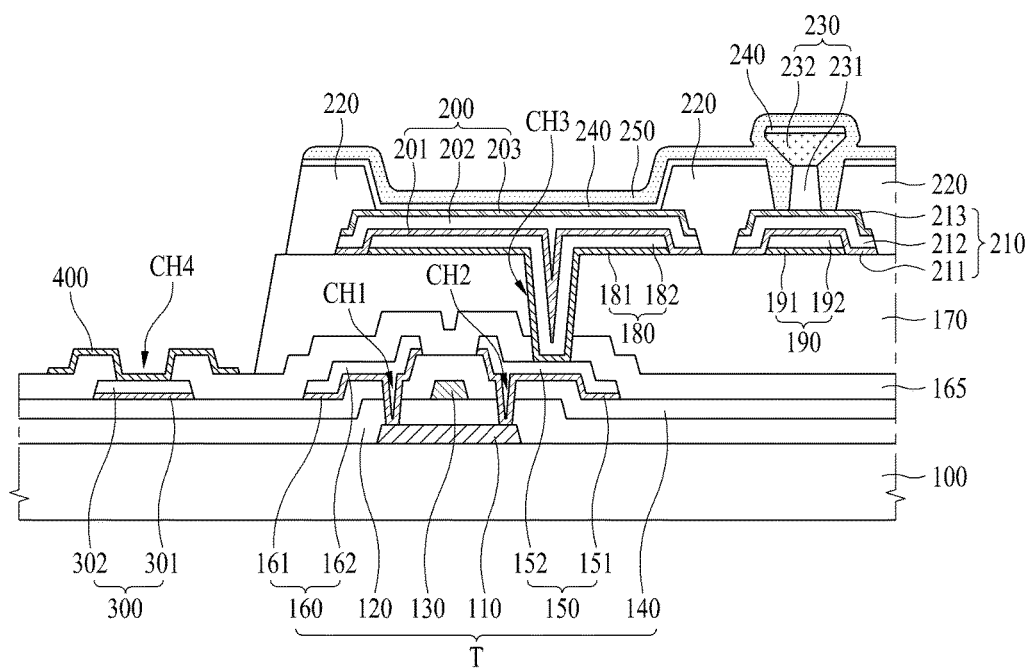

Subsequently, as illustrated in FIG. 4H, a cathode electrode 250 may be formed on the organic emission layer 240.

The cathode electrode 250 may be formed to be connected to the second auxiliary electrode 210 through the separation space between the partition wall 230 and the bank 220. The cathode electrode 250 may be formed by a deposition process such as a sputtering process which is not good in straightness of a deposited material, and thus, the cathode electrode 250 may be deposited in the separation space between the partition wall 230 and the bank 220 in a process of depositing the cathode electrode 250.

FIGS. 5A to 5I are cross-sectional views illustrating a method of manufacturing an organic light emitting display apparatus according to another embodiment of the present invention and relates to a method of manufacturing the above-described organic light emitting display apparatus of FIG. 3. Hereinafter, descriptions repetitive of the above-described embodiment are omitted.

Figure 5A:
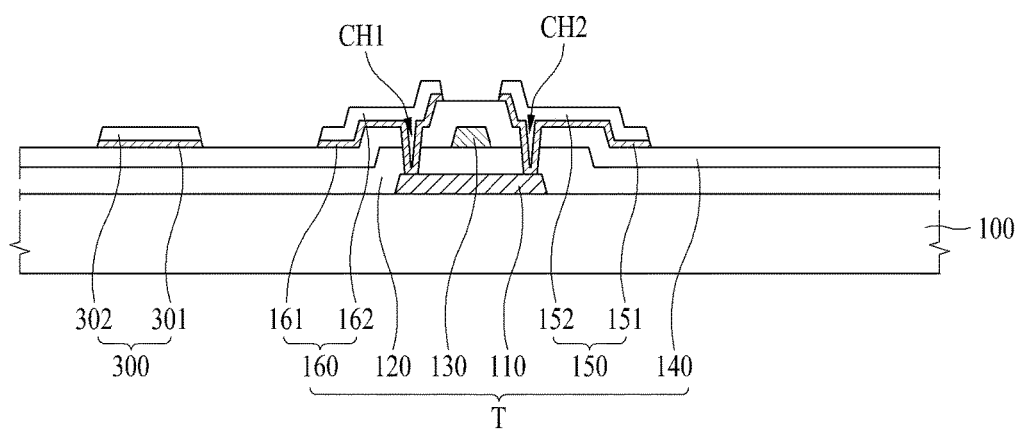
FIGS. 5A to 5I are cross-sectional views illustrating a method of manufacturing an organic light emitting display apparatus according to another embodiment of the present invention.

First, as illustrated in FIG. 5A, an active layer 110, a gate insulation layer 120, a gate electrode 130, an interlayer dielectric 140, a source electrode 150, a drain electrode 160, and a signal pad 300 may be sequentially formed on a substrate 100. Therefore, a TFT T may be formed in the active area AA, and the signal pad 300 may be formed in the pad area PA.

Figure 5B:
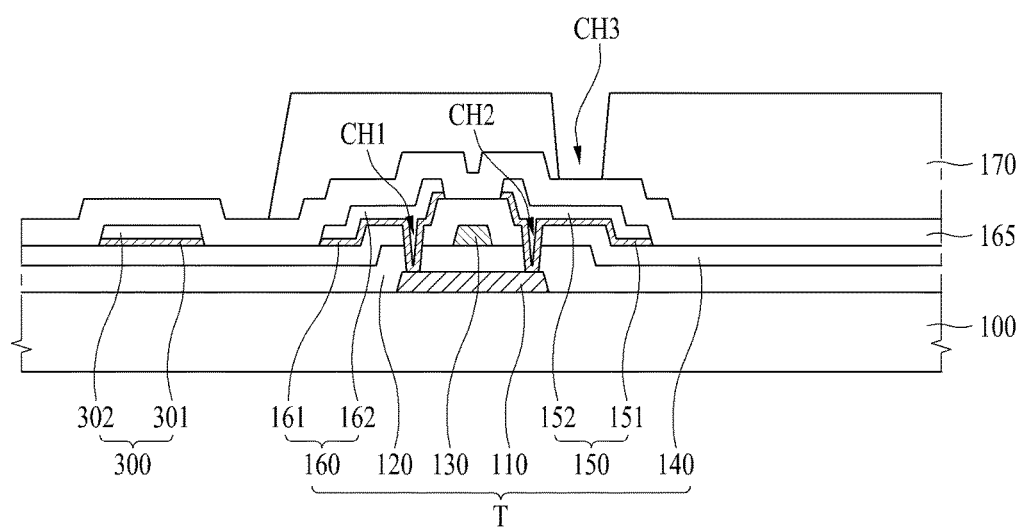

Subsequently, as illustrated in FIG. 5B, a passivation layer 165 may be formed on the source electrode 150, the drain electrode 160, and the signal pad 300, and a planarization layer 170 may be formed on the passivation layer 165. The planarization layer 170 may include a third contact hole CH3.

Figure 5C:
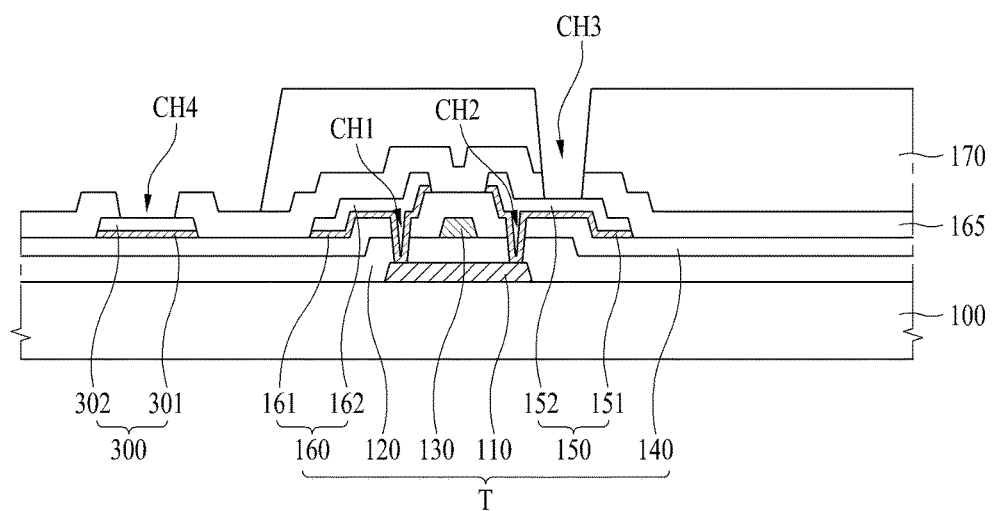

Subsequently, as illustrated in FIG. 5C, the third contact hole CH3 and a fourth contact hole CH4 may be formed in the passivation layer 165. The source electrode 150 may be exposed to the outside by the third contact hole CH3 which is included in the passivation layer 165 and the planarization layer 170, and the signal pad 300 may be exposed to the outside by the fourth contact hole CH4 included in the passivation layer 165.

Figure 5D:
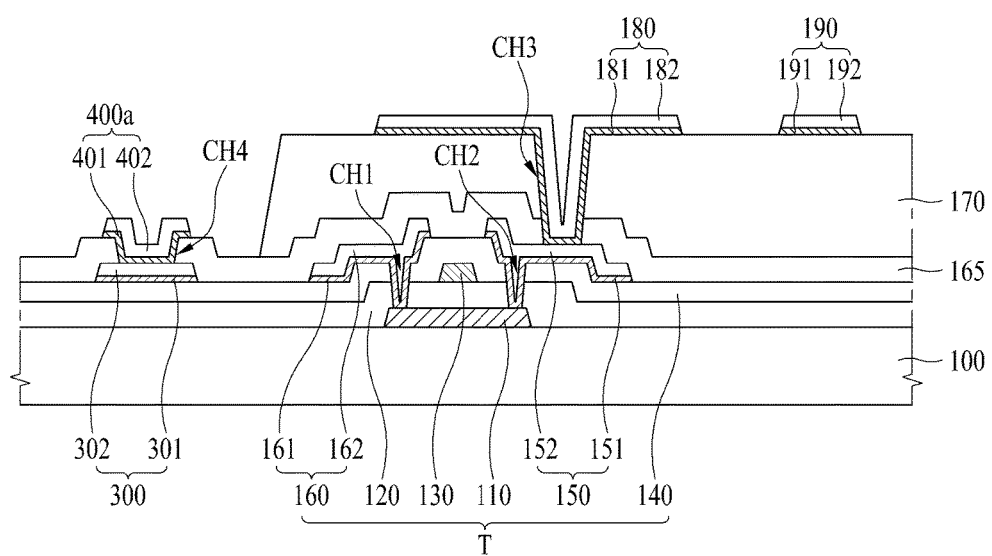

Subsequently, as illustrated in FIG. 5D, a first anode electrode 180 and a first auxiliary electrode 190 may be formed on the planarization layer 170 in the active area AA, and a first pad electrode 400a may be formed on the passivation layer 165 in the pad area PA.

The first anode electrode 180 may be configured with a first lower anode electrode 181 and a first upper anode electrode 182, and the first auxiliary electrode 190 may be configured with a first lower auxiliary electrode 191 and a first upper auxiliary electrode 192. The first pad electrode 400a may be configured with a lower pad electrode 401 and an upper pad electrode 402.

Figure 5E:
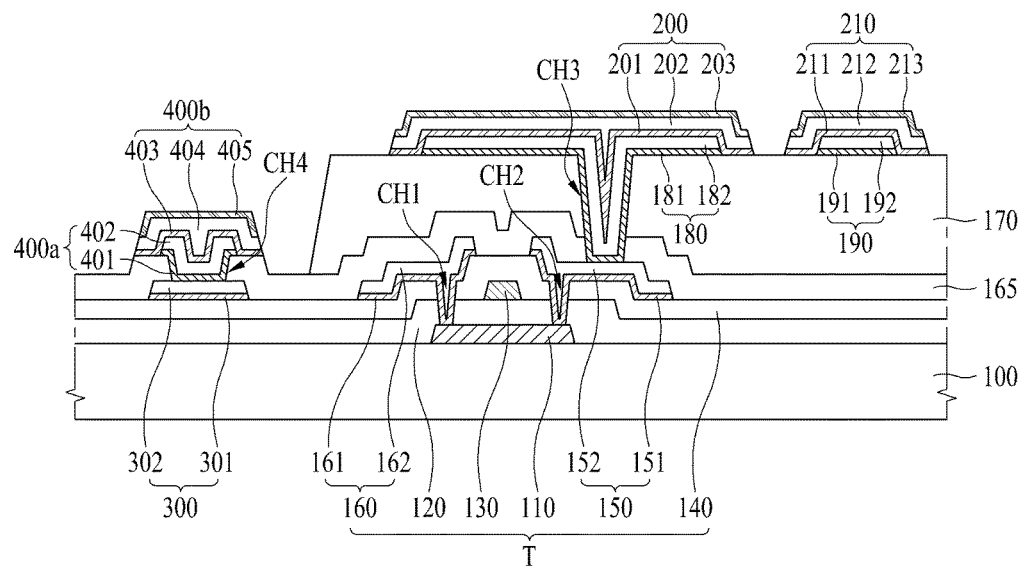

Subsequently, as illustrated in FIG. 5E, a second anode electrode 200 may be formed on a first anode electrode 180 in the active area AA, a second auxiliary electrode 210 may be formed on a first auxiliary electrode 190 in the active area AA, and a second pad electrode 400b may be formed on the first pad electrode 400a in the pad area PA.

The second anode electrode 200 may be pattern-formed to cover a top and a side surface of the first anode electrode 180, and the second auxiliary electrode 210 may be pattern-formed to cove a top and a side surface of the first auxiliary electrode 190. The second pad electrode 400b may be pattern-formed to cover a top and a side surface of the first pad electrode 400a.

The second pad electrode 400b may act as a cover pad electrode of the first pad electrode 400a and may include a lower cover pad electrode 403, a center cover pad electrode 404, and an upper cover pad electrode 405.

The second anode electrode 200, the second auxiliary electrode 210, and the second pad electrode 400b may be simultaneously formed of the same material through the same patterning process.

Figure 5F:
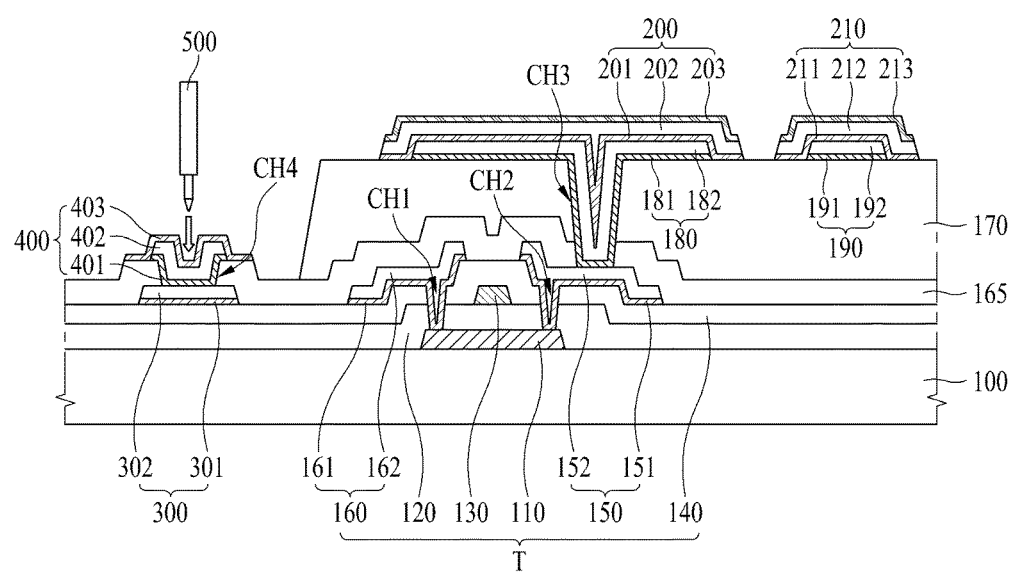

Subsequently, as illustrated in FIG. 5F, by removing the center cover pad electrode 404 and the upper cover pad electrode 405, only the lower cover pad electrode 403 may be left as a cover pad electrode. Therefore, a pad electrode 400 including a lower pad electrode 401, an upper pad electrode 402, and a lower cover pad electrode 403 may be finished.

A process of removing the center cover pad electrode 404 and the upper cover pad electrode 405 may be performed by using a laser irradiation process using a laser irradiation apparatus 500.

Figure 5G:
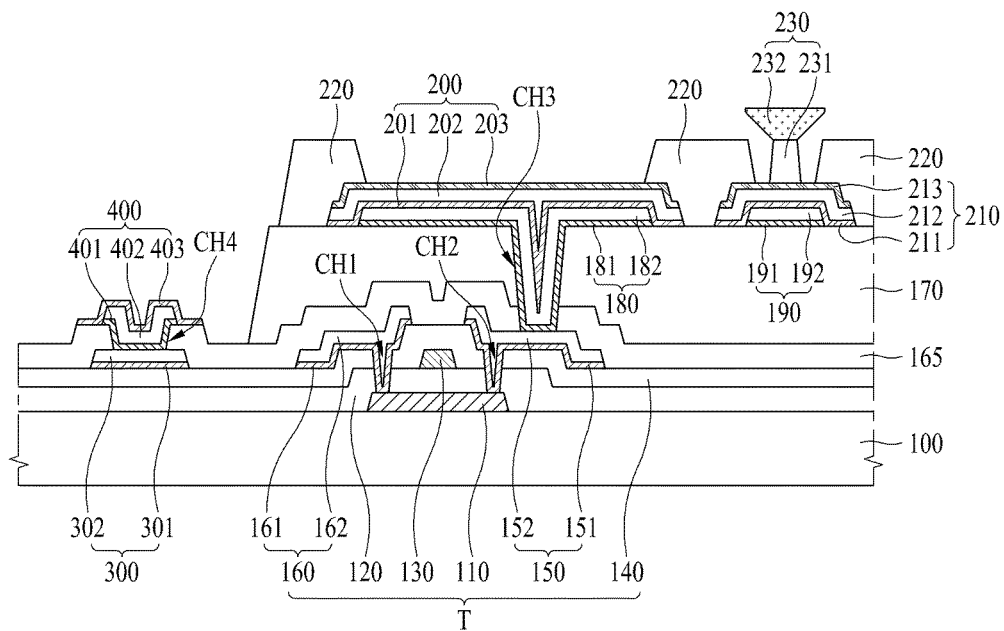

Subsequently, as illustrated in FIG. 5G, a bank 220 may be formed on one side and the other side of the second anode electrode 200 to expose a top of the second anode electrode 200. Also, the bank 220 may be formed on one side and the other side of the second auxiliary electrode 210 to expose a top of the second auxiliary electrode 210. Also, a first partition wall 231 and a second partition wall 232 may be sequentially formed on the exposed top of the second auxiliary electrode 210. The partition wall 230 may be formed to be separated from the bank 220 by a certain distance, and thus, a separation space may be provided between the partition wall 230 and the bank 220.

Figure 5H:
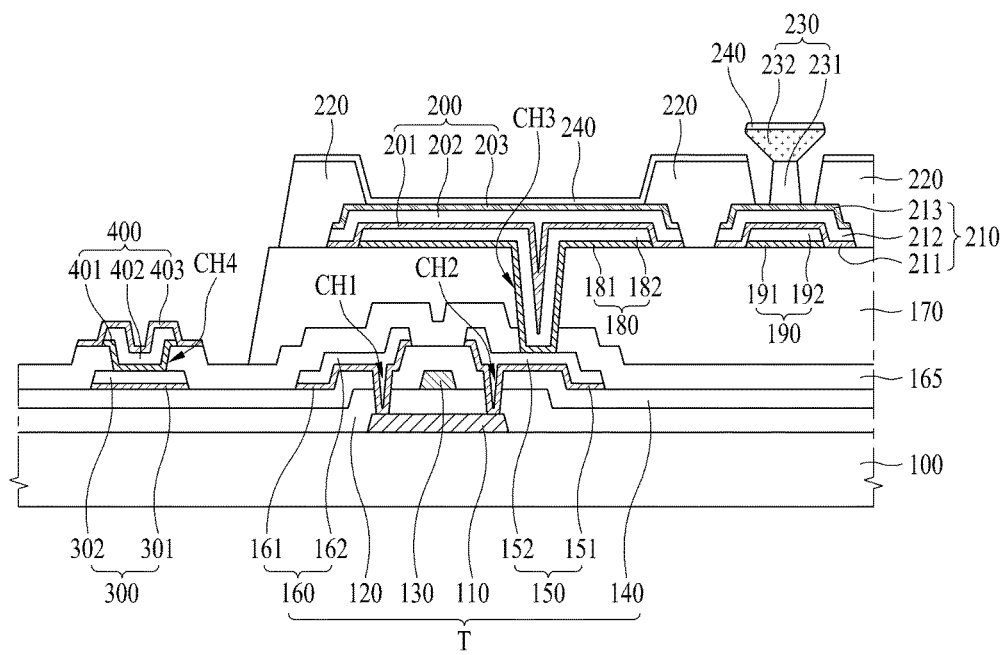

Subsequently, as illustrated in FIG. 5H, an organic emission layer 240 may be formed on the second anode electrode 200. The organic emission layer 240 may be deposited on tops of the bank 220 and the partition wall 230, but is not deposited in the separation space between the partition wall 230 and the bank 220.

Figure 5I:
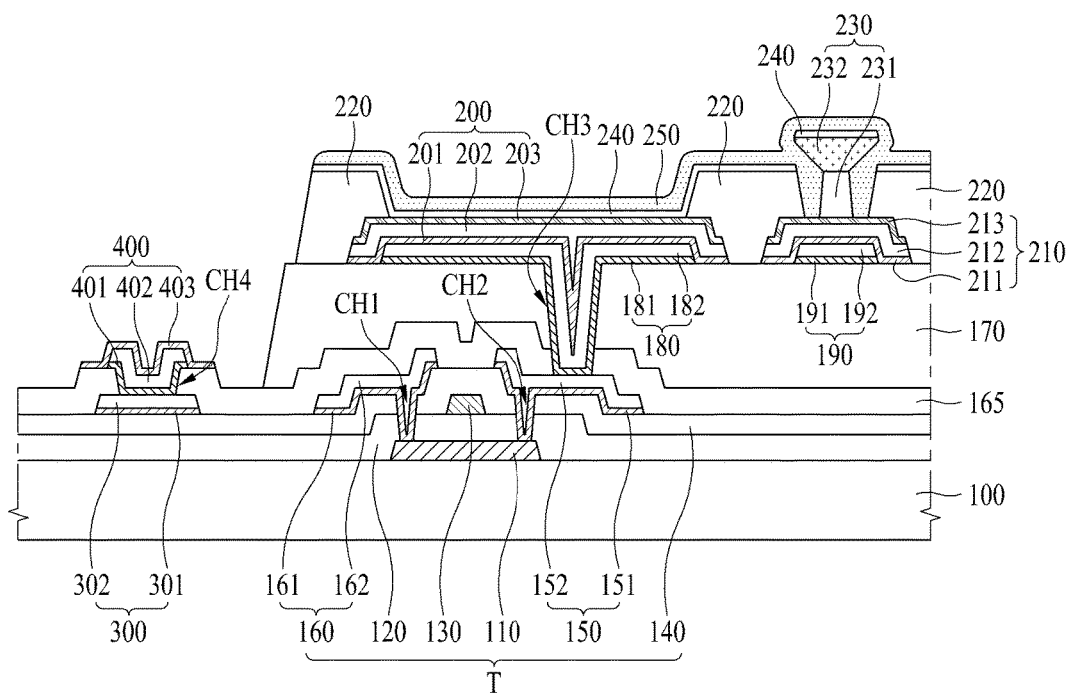

Subsequently, as illustrated in FIG. 5I, a cathode electrode 250 may be formed on the organic emission layer 240. The cathode electrode 250 may be formed to be connected to the second auxiliary electrode 210 through the separation space between the partition wall 230 and the bank 220.

In the embodiments of the present invention, the pad electrode may be formed to cover the top of the signal pad. Particularly, the top of the pad electrode may be formed lower in oxidation rate than the top of the signal pad, thereby preventing the signal pad from being corroded. Accordingly, the signal pad may be formed in a two-layer structure which includes the lower signal pad and the upper signal pad not being vulnerable to corrosion.

Moreover, according to the embodiments of the present invention, the contact hole for externally exposing the source electrode and the contact hole for externally exposing the signal pad may be simultaneously formed in the passivation layer. Thus, one mask process does not increase (e.g. the number of masking steps does not have to be increased).

Moreover, according to the embodiments of the present invention, the two auxiliary electrodes (for example, the first and second auxiliary electrodes) may be stack-formed for lowering the resistance of the cathode electrode. Thus, the desired resistance characteristic of the auxiliary electrode is more easily adjusted. That is, since the auxiliary electrode is formed on the same layer as a layer on which the anode electrode is formed, there is a limitation in increasing a size of the auxiliary electrode. Therefore, according to the embodiments of the present invention, the auxiliary electrode may be stacked in two layers, and thus, provided is a structure of the auxiliary electrode which is more effective to lower the resistance of the cathode electrode.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an organic light emitting display apparatus, the method comprising:
    forming a source electrode, a drain electrode, and a signal pad on a substrate;
    forming a passivation layer on the source electrode, the drain electrode and the signal pad, wherein the signal pad comprises a lower signal pad and an upper signal pad, an oxidation rate of the lower signal pad is lower than an oxidation rate of the upper signal pad, and a resistance of the upper signal pad is lower than a resistance of the lower signal pad;
    simultaneously forming a contact hole externally exposing the source electrode or the drain electrode, and a contact hole externally exposing the signal pad by removing predetermined regions of the passivation layer;
    forming an anode electrode connected to the source electrode or the drain electrode, an auxiliary electrode separated from the anode electrode, and a pad electrode connected to the signal pad and covering the exposed signal pad, wherein a top of the pad electrode has a lower oxidation rate than a top of the signal pad;
    forming an organic emission layer on the anode electrode; and
    forming a cathode electrode, connected to the auxiliary electrode, on the organic emission layer,
    wherein the forming of the anode electrode comprises forming a first anode electrode and a second anode electrode,
    wherein the forming the auxiliary electrode comprises forming a first auxiliary electrode and a second auxiliary electrode, and
    wherein the second anode electrode is formed on the first anode electrode, and the second auxiliary electrode is formed on the first auxiliary electrode.

2. The method of claim 1,
    wherein the second anode electrode covers a top and a side surface of the first anode electrode, and the second auxiliary electrode covers a top and a side surface of the first auxiliary electrode.

3. The method of claim 1, wherein the first anode electrode comprises a first lower anode electrode and a first upper anode electrode.

4. The method of claim 3, wherein an oxidation rate of the first lower anode electrode is lower than an oxidation rate of the first upper anode electrode, and
    wherein a resistance of the first upper anode electrode is lower than a resistance of the first lower anode electrode.

5. The method of claim 1, wherein the second anode electrode comprises a second lower anode electrode, a second center anode electrode, and a second upper anode electrode.

6. The method of claim 5, wherein an oxidation rate of each of the second lower anode electrode and the second upper anode electrode is lower than an oxidation rate of the second center anode electrode, and wherein a resistance of the second center anode electrode is lower than a resistance of each of the second lower anode electrode and the second upper anode electrode.

7. The method of claim 3, wherein the pad electrode comprises a same material as that of the first lower anode electrode.

8. The method of claim 1, wherein
the forming of the pad electrode comprises forming a lower pad electrode and an upper pad electrode, and
the forming of the second anode electrode and the second auxiliary electrode comprises removing the upper pad electrode by using an etchant.

9. The method of claim 1, wherein
the forming of the second anode electrode and the second auxiliary electrode comprises forming a second pad electrode that includes a lower cover pad electrode covering a top and a side surface of the first pad electrode, a center cover pad electrode, and an upper cover pad electrode, and
after the forming of the second pad electrode, removing the center cover pad electrode and the upper cover pad electrode.

10. The method of claim 1, further comprising, before the forming of the organic emission layer, forming a bank on one side and the other side of the second auxiliary electrode and forming a partition wall on a top of the second auxiliary electrode,
wherein
the organic emission layer is not deposited in a separation space between the bank and the partition wall, and
the cathode electrode is deposited in the separation space between the bank and the partition wall.

* * * * *